United States Patent
Kim

(10) Patent No.: US 7,982,493 B1
(45) Date of Patent: Jul. 19, 2011

(54) SEMICONDUCTOR INTEGRATED CIRCUIT FOR CONTROLLING OUTPUT DRIVING FORCE

(75) Inventor: Ki Up Kim, Ichon-shi (KR)

(73) Assignee: Hynix Semiconductor Inc., Ichon-si (KR)

( * ) Notice: Subject to any disclaimer, the term of this patent is extended or adjusted under 35 U.S.C. 154(b) by 0 days.

(21) Appl. No.: 12/839,318

(22) Filed: Jul. 19, 2010

(30) Foreign Application Priority Data

Jan. 29, 2010 (KR) .................. 10-2010-0008649

(51) Int. Cl.
*H03K 17/16* (2006.01)
(52) U.S. Cl. .................. 326/30; 326/27; 326/86
(58) Field of Classification Search .................. None
See application file for complete search history.

(56) References Cited

U.S. PATENT DOCUMENTS

| 5,248,907 | A * | 9/1993 | Lin et al. .................. 326/33 |
| 7,054,202 | B2 | 5/2006 | Lee et al. |
| 7,151,703 | B2 | 12/2006 | Lee et al. |
| 2001/0017554 | A1 * | 8/2001 | Tsuji .................. 327/112 |
| 2003/0071663 | A1 * | 4/2003 | Taguchi et al. .................. 327/112 |
| 2004/0027161 | A1 * | 2/2004 | Oertle et al. .................. 326/81 |
| 2005/0285646 | A1 * | 12/2005 | Rashid .................. 327/170 |

FOREIGN PATENT DOCUMENTS

| JP | 09-147560 | 6/1997 |
| JP | 2004-362756 | 12/2004 |
| KR | 10-2008-0077554 A | 8/2008 |
| KR | 10-2009-0114959 A | 11/2009 |

* cited by examiner

*Primary Examiner* — Rexford N Barnie
*Assistant Examiner* — Jany Tran
(74) *Attorney, Agent, or Firm* — Echelon Law Group, PC

(57) ABSTRACT

A semiconductor integrated circuit includes a pre driver unit configured to receive a pre drive signal and a driving force control signal and output a main drive signal; a main driver unit configured to receive the main drive signal and output output data to an output terminal; a terminal connecting unit configured to receive a determination signal and connect to or disconnect from the output terminal in response to the determination signal; a terminal sensing unit configured to sense the output terminal and output a terminal state signal; and a driving force determining unit configured to receive a reset signal and the terminal state signal and output the driving force control signal.

7 Claims, 5 Drawing Sheets

SEMICONDUCTOR INTEGRATED CIRCUIT FOR CONTROLLING OUTPUT DRIVING FORCE

CROSS-REFERENCES TO RELATED APPLICATION

The present application claims priority under 35 U.S.C. §119(a) to Korean Application No. 10-2010-0008649 filed on Jan. 29, 2010, in the Korean Intellectual Property Office, which is incorporated herein by reference in its entirety as set forth in full.

BACKGROUND

1. Technical Field

The present invention relates to semiconductor integrated circuits, and more particularly, to semiconductor integrated circuits with output buffer devices.

2. Related Art

A data output buffer device used in a semiconductor circuit may serve as a device that outputs internal data to an external output terminal of a chip such as a DRAM (dynamic random access memory). The data output buffer device may be designed in consideration of a high or low level output voltage level margin, output voltage-current matching, a decoupling cap, a slew rate, etc.

The slew rate represents a maximum amount of change of an output voltage with respect to a unit time. Exemplifying an output circuit which has a gain of 1, an output voltage immediately rises from 0V to 1V in an ideal circuit when an input voltage increases from 0V to 1V. However, in an actual circuit with a slew rate of K, an output voltage does not simultaneously rise in conformity with an input voltage. Instead, the output voltage rises to 1V as a ramp function with a slope of K. Therefore, it is important to control the slew rate of an output circuit to conform to the specification of a product. When there are large and small slew rates, an intensity for driving a signal, that is, a driving force, is large and small. In the case of an output buffer device including a MOS transistor, a slew rate may depend on an amount of current that can flow through the MOS transistor.

An application connected to a semiconductor memory apparatus may use a termination resistance (Rtt) and a termination voltage (Vtt) to substantially prevent signal distortion by a reflection effect occurring at a far end due to impedance mismatching in signal transmission channels as the frequency of a signal outputted from the semiconductor memory apparatus increases.

Semiconductor memory apparatuses are used in various applications such as digital TVs, printers, digital cameras, etc. Memories fabricated to be optimized for such various applications are called consumer memories. Consumer memories are not used according to the same specification, but are separately designed and fabricated in conformity with the characteristics of the respective applications. As the use of consumer memories has gradually expanded, revision costs incurred for redesigning memory apparatuses having similar functions to be suited for different applications has increased.

Among the applications using the consumer memories, applications which do not use a termination resistance (Rtt) and a termination voltage (Vtt) exist. In this case, data output characteristics are likely to be degraded.

FIG. 1 is a circuit diagram illustrating a conventional output buffer device when a termination resistance (Rtt) and a termination voltage (Vtt) are used by an external receiver of an application.

A conventional output buffer device may include a pre driver unit 100 and a main driver unit 200. The pre-driver unit 100 may be configured to receive a pre pull up signal PUP and a pre pull down signal PDN as a pre drive signal and output a pull up signal UP and a pull down signal DN as a main drive signal. The main driver unit 200 may be configured to receive the main drive signal and output output data to an output terminal.

In response to the main drive signal, the main driver unit 200 may output the output data to the output terminal by swinging the output data to the level of an output power supply voltage VDDQ or an output ground voltage VSSQ. The output data may be swung with a slew rate due to the current properties of the transistors included in the main driver unit 200.

The outputted data may be transmitted to an external receiver connected to the main driver unit 200 by way of a bus. A bus resistance Rs is a resistance of a bus that connects the output terminal and the external receiver.

The external receiver may have a termination resistance Rtt to which a termination voltage Vtt is applied. The existence of the termination resistance Rtt and the termination voltage Vtt may vary depending upon an application connected. As stated above, among applications using consumer memories, applications which do not use the termination resistance Rtt and the termination voltage Vtt exist.

If the output buffer device is turned off and resumes the state of not driving the bus, that is, a high impedance (high-Z) state, the voltage level of the bus may change to the level of the termination voltage Vtt due to the termination voltage Vtt. The termination voltage Vtt may serve as a reference voltage for an output. When the output buffer device is changed from the off state, that is, the high impedance (high-Z) state, to the on state of driving output data, a middle point of signal swing may result. The termination voltage Vtt in the specification of a DRAM has a middle level (VDDQ/2) between the output power supply voltage VDDQ and the output ground voltage VSSQ. If the output buffer device is turned on and drives output data, the voltage level of the output terminal may change from the existing termination voltage Vtt=VDDQ/2 to the output power supply voltage VDDQ or the output ground voltage VSSQ. The change range at this time may correspond to one half (VDDQ/2) of the output power supply voltage VDDQ.

In the case of an application that does not use the termination resistance Rtt and the termination voltage Vtt in the external receiver, in the high impedance (high-Z) state in which the output buffer device is turned off, the voltage level of the bus may have a random value between the output power supply voltage VDDQ and the output ground voltage VSSQ applied to the output buffer device. In the high impedance (high-Z) state, when the output buffer device is turned on and starts to drive output data, the change range of the voltage level of first output data from the output terminal may be unpredictable. In the worst case, the change range of the voltage level of first output data from the output terminal may be the level of the output power supply voltage VDDQ since the voltage level of the first output data may change from the output power supply voltage VDDQ to the output ground voltage VSSQ or vice versa. In the worst case, the change range may increase by VDDQ/2 when compared to the case of using the termination resistance Rtt and the termination voltage Vtt. Accordingly, as access time to the first data is retarded, data eye may decrease or an access time from a clock (Tac) may lengthen, whereby data output characteristics are likely to be degraded.

SUMMARY

In one embodiment of the present invention, a semiconductor integrated circuit may comprise: a pre driver unit configured to receive a pre drive signal and a driving force control signal and output a main drive signal; a main driver unit configured to receive the main drive signal and output output data to an output terminal; a terminal connecting unit configured to receive a determination signal and connect to or disconnect from the output terminal in response to the determination signal; a terminal sensing unit configured to sense the output terminal and output a terminal state signal; and a driving force determining unit configured to receive a reset signal and the terminal state signal and output the driving force control signal.

In another embodiment of the present invention, a semiconductor integrated circuit may comprise: a pre driver unit configured to receive a pre drive signal and a driving force control signal and output a main drive signal; a main driver unit comprising a plurality of drivers, wherein at least one of the plurality of drivers may be activated in response to the main drive signal; and a driving force control block configured to sense whether a voltage supply source is connected to an output terminal of the main driver unit, activate or deactivate the driving force control signal, and output the driving force control signal.

BRIEF DESCRIPTION OF THE DRAWINGS

Features, aspects, and embodiments are described in conjunction with the attached drawings, in which.

DETAILED DESCRIPTION

Figure 1:
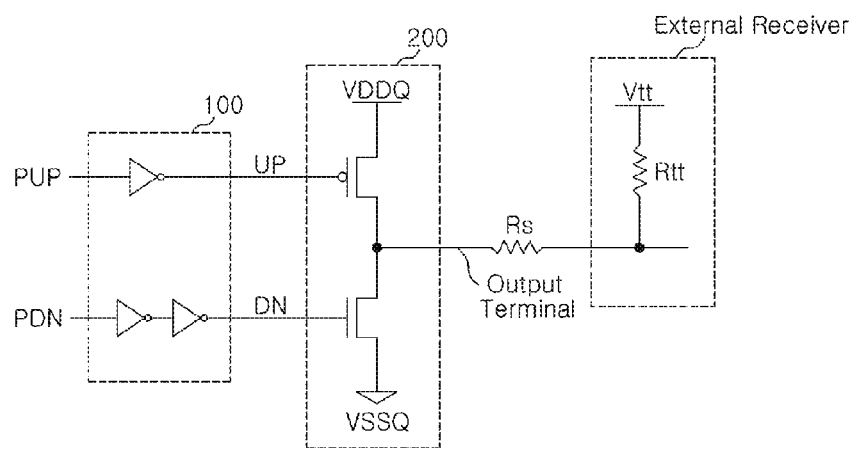
FIG. 1 is a circuit diagram illustrating a conventional output buffer device.

Reference will now be made in detail to the exemplary embodiments consistent with the present disclosure, examples of which are illustrated in the accompanying drawings. Whenever possible, the same reference numerals will be used throughout the drawings to refer to the same or like parts.

Figure 2:
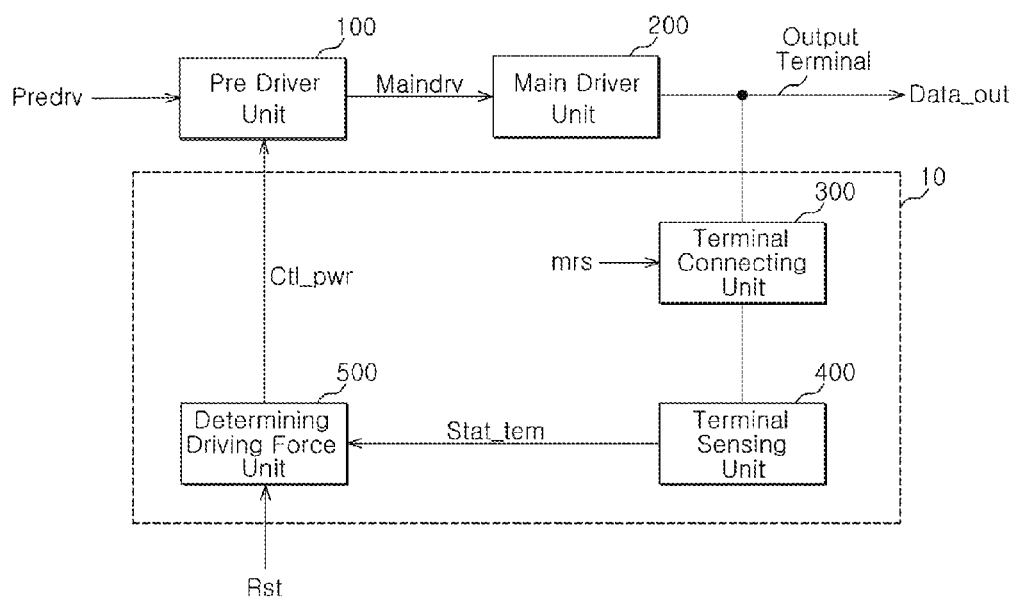
FIG. 2 is a block diagram illustrating a semiconductor integrated circuit in accordance with one embodiment of the invention.

FIG. 2 is a block diagram illustrating a semiconductor integrated circuit in accordance with one embodiment of the present invention. The semiconductor integrated may include a pre driver unit 100, a main driver unit 200, a terminal connecting unit 300, a terminal sensing unit 400, and a driving force determining unit 500.

The semiconductor integrated circuit may be configured to sense the state of an output terminal through the terminal connecting unit 300, the terminal sensing unit 400, and the driving force determining unit 500. The semiconductor integrated circuit may drive output data Data_out by changing a driving force through the pre driver unit 100 and the main driver unit 200 based on a sensed result.

The terminal connecting unit 300, the terminal sensing unit 400, and the driving force determining unit 500 in FIG. 2 may be regarded as a block for sensing the state of the output terminal and outputting a driving force control signal Ctl_pwr, and are therefore collectively referred to as a driving force control block 10. The driving force control block 10 may sense the output terminal of the main driver unit 200 and output the driving force control signal Ctl_pwr by activating or deactivating the driving force control signal Ctl_pwr.

The pre driver unit 100 may be configured to receive a pre drive signal Predrv and the driving force control signal Ctl_pwr and output a main drive signal Maindrv. The pre drive signal Predrv may be a signal for determining to what voltage level the main driver unit 200 will output the output data Data_out to the output terminal. The driving force control signal Ctl_pwr is a signal for determining with which driving force the main driver unit 200 will output the output data Data_out to the output terminal.

The main driver unit 200 may be configured to receive the main drive signal Maindrv and output the output data Data_out. The main drive signal Maindrv may have information regarding to what voltage level the main driver unit 200 will output the output data Data_out and information regarding with what driving force the main driver unit 200 will output the output data Data_out.

The terminal connecting unit 300 may be disposed between the output terminal and the terminal sensing unit 400. The terminal connecting unit 300 may be configured to connect or disconnect the output terminal and the terminal sensing unit 400 in response to a determination signal mrs.

The terminal sensing unit 400 may be configured to be connected to and sense the output terminal when the terminal connecting unit 300 is activated. The terminal sensing unit 400 may output a sensed result to the driving force determining unit 500 as a terminal state signal Stat_tem. The terminal state signal Stat_tem may include information regarding the states of the output terminal. The states of the output terminal may include the voltage level, the amount of current, the resistance value, etc. of the output terminal. In the embodiment shown in FIG. 4, which will be described later in greater detail below, the terminal sensing unit 400 may sense information regarding whether there is a power supply source connected to the output terminal.

The driving force determining unit 500 may be configured to receive a reset signal Rst and the terminal state signal Stat_tem and output the driving force control signal Ctl_pwr to the pre driver unit 100. As described above, the driving force control signal Ctl_pwr that may be outputted from the driving force determining unit 500 may be a signal for determining with what driving force the main driver unit 200 will output the output data Data_out. The driving force determining unit 500 may deactivate and output the driving force determining signal Ctl_pwr in response to the reset signal Rst. The driving force determining unit 500 may activate and output the driving force determining signal Ctl_pwr in response to the terminal state signal Stat_tem.

The semiconductor integrated circuit shown in FIG. 2 may sense the state of the output terminal and drive the output data Data_out by changing a driving force based on a sensed result.

Figure 3:
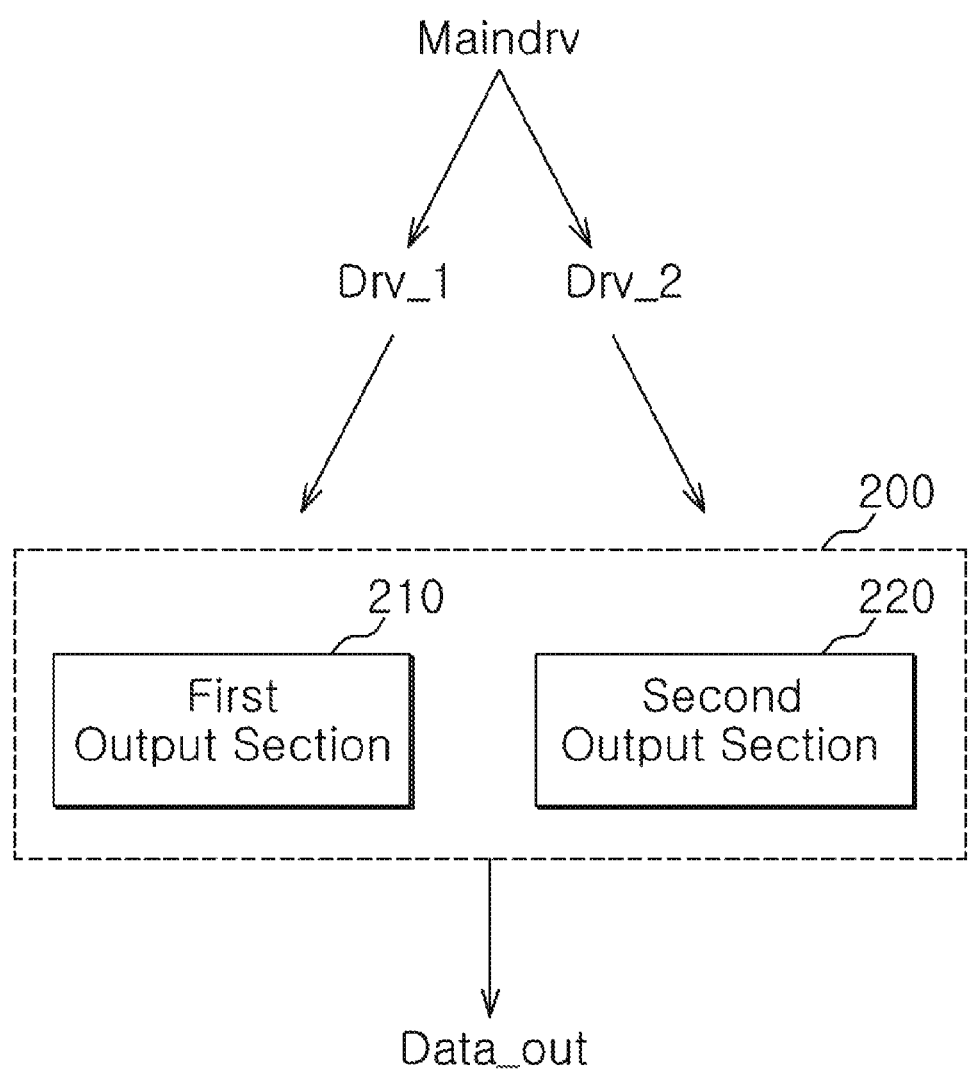
FIG. 3 is a block diagram of one embodiment of a main driver unit shown in FIG. 2.

FIG. 3 is a block diagram of the main driver unit 200 shown in FIG. 2. The main driver unit 200 may include a first output section 210 and a second output section 220. The main driver unit 200 may control a driving force by activating at least one of the first output section 210 and the second output section 220. For example, when selecting and activating at least one of the first output section 210 and the second output section 220, a driving force may be controlled based on what output section is to be activated and may be increased by activating all of the first output section 210 and the second output section 220. In FIG. 3, the main drive signal Maindrv that may be inputted from the pre driver unit 100 may include a first drive signal Drv_1 capable of activating or deactivating the first output section 210 and a second drive signal Drv_2 capable of activating or deactivating the second output section 220.

While the main driver unit 200 shown in FIG. 3 has two output sections to control a driving force, the driving force may be controlled in a more precise manner when the main driver unit 200 has more than two output sections in compliance with a design by a person having ordinary skill in the art.

Figure 4:
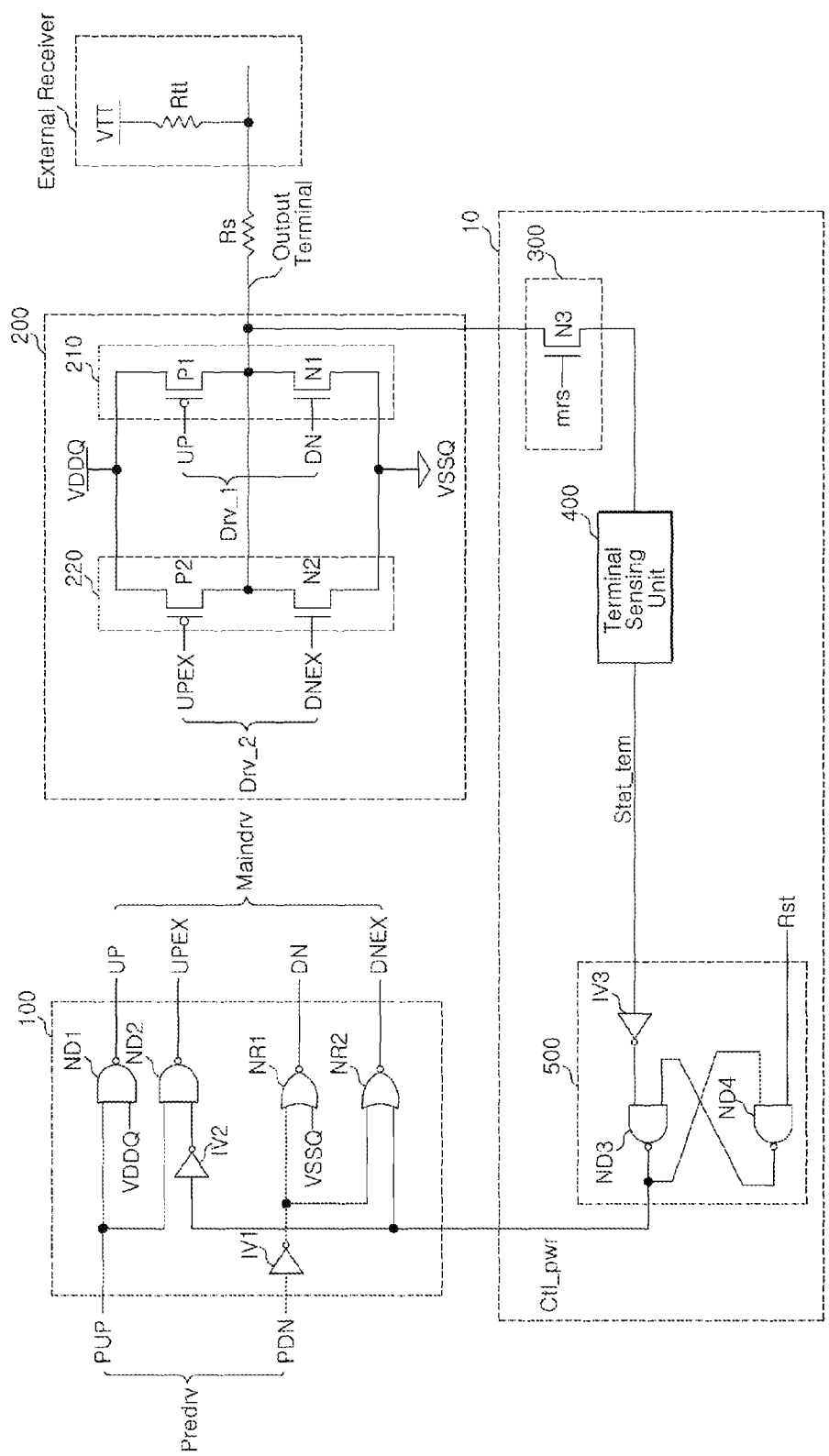
FIG. 4 is a circuit diagram of one embodiment of the semiconductor integrated circuit shown in FIG. 2.

FIG. 4 illustrates one embodiment of the semiconductor integrated circuit shown in FIG. 2. FIG. 4 is a circuit diagram of an output buffer device that may change a driving force based on whether a termination resistance Rtt and a termination voltage Vtt exist in a receiver of an external application connected to the output terminal.

The output buffer device shown in FIG. 4 may include the pre driver unit 100, the main driver unit 200, the terminal connecting unit 300, the terminal sensing unit 400, and the driving force determining unit 500. Further, as shown in FIG. 3, the main driver unit 200 may include the first output section 210 and the second output section 220. Rs denotes the resistance of a bus between the output terminal connected to the main driver unit 200 and the receiver of the external application. While it is illustrated in FIG. 4 that the receiver of the external application may use the termination voltage Vtt and the termination resistance Rtt, this is to easily describe the case where the external receiver of the application uses the termination voltage Vtt and the termination resistance Rtt in subsequent explanation of operations of the output buffer device. As stated above, among applications which employ consumer memories, there may be not only a case in which the termination voltage Vtt and the termination resistance Rtt exist but also a case in which the termination voltage Vtt and the termination resistance Rtt do not exist.

The output buffer device may be configured to sense the state of the output terminal through the terminal connecting unit 300, the terminal sensing unit 400, and the driving force determining unit 500. The output buffer device may output the output data Data_out by changing a driving force through the pre driver unit 100 and the main driver unit 200 based on a sensed result.

As in FIG. 2, the terminal connecting unit 300, the terminal sensing unit 400 and the driving force determining unit 500 shown in FIG. 4 may be regarded as a block for sensing the state of the output terminal and outputting the driving force control signal Ctl_pwr, and are therefore collectively referred to as a driving force control block 10. The driving force control block 10 may sense whether a voltage supply source is connected to the output terminal of the main driver unit 200 and output the driving force control signal Ctl_pwr by activating or deactivating the driving force control signal Ctl_pwr.

The pre driver unit 100 may include a first inverter IV1, a second inverter IV2, a first NAND gate ND1, a second NAND gate ND2, a first NOR gate NR1, and a second NOR gate NR2. The pre driver unit 100 may be configured to receive the pre drive signal Predrv and the driving force control signal Ctl_pwr and output the main drive signal Maindrv.

The pre drive signal Predrv may includes a pre pull up signal PUP and a pre pull down signal PDN. The main drive signal Maindrv may include the first drive signal Drv_1 and the second drive signal Drv_2. The first drive signal Drv_1 may include the pull up signal UP and the pull down signal DN. The second drive signal Drv_2 may include a pull up extension signal UPEX and a pull down extension signal DNEX.

The first NAND gate ND1 may receive and NAND the pre pull up signal PUP and the output power supply voltage VDDQ, and outputs the pull up signal UP. The second NAND gate ND2 may receive and NAND the pre pull up signal PUP and an inverted value of the driving force control signal Ctl_pwr, and output the pull up extension signal UPEX. The first NOR gate NR1 may receive and NOR an inverted value of the pre pull down signal PDN and the output ground voltage VSSQ, and output the pull down signal DN. The second NOR gate NR2 may receive and NOR an inverted value of the pre pull down signal PDN and the driving force control signal Ctl_pwr, and output the pull down extension signal DNEX. The first inverter IV1 may receive and invert the pre pull down signal PDN, and output the inverted value of the pre pull down signal PDN to the first NOR gate NR1 and the second NOR gate NR2. The second inverter IV2 may receive and invert the driving force control signal Ctl_pwr, and output the inverted value of the driving force control signal Ctl_pwr to the second NAND gate ND2. The pull up signal UP and the pull down signal DN may be outputted at the inverted level of the pre pull up signal PUP and the level of the pre pull down signal PDN, respectively, regardless of the driving force control signal Ctl_pwr. The pull up extension signal UPEX may be outputted at the inverted level of the pre pull up signal PUP in the same way as the pull up signal UP when the driving force control signal Ctl_pwr is a low level. The pull up extension signal UPEX may be outputted at a high level when the driving force control signal Ctl_pwr is a high level. The pull down extension signal DNEX may be outputted at the level of the pre pull down signal PDN in the same way as the pull down signal DN when the driving force control signal Ctl_pwr is the low level. The pull down extension signal DNEX may be outputted at a low level when the driving force control signal Ctl_pwr is the high level.

The main driver unit 200 may include the first output section 210 and the second output section 220. The first output section 210 may includes a first PMOS transistor P1 and a first NMOS transistor N1. The first PMOS transistor P1 may have a source terminal that is connected to the output power supply voltage VDDQ, a drain terminal that is connected to the output terminal, and a gate terminal to which the pull up signal UP is applied. The first NMOS transistor N1 may be connected in series to the first PMOS transistor P1. The first NMOS transistor N1 may have a source terminal that is connected to the output ground voltage VSSQ, a drain terminal that is connected to the output terminal, and a gate terminal to which the pull down signal DN is applied.

The second output section 220 may include a second PMOS transistor P2 and a second NMOS transistor N2. The second PMOS transistor P2 may include a source terminal that is connected to the output power supply voltage VDDQ, a drain terminal that is connected to the output terminal, and a gate terminal to which the pull up extension signal UPEX is applied. The second NMOS transistor N2 may be connected in series to the second PMOS transistor P2. The second NMOS transistor N2 may have a source terminal that is connected to the output ground voltage VSSQ, a drain terminal that is connected to the output terminal, and a gate terminal to which the pull down extension signal DNEX is applied.

The first output section 210 and the second output section 220 are connected in parallel with each other and are commonly connected to the output terminal. The main driver unit 200 may output the output data Data_out to the output terminal by activating at least one of the first output section 210 and the second output section 220 in response to the main drive signal Maindrv.

The output buffer device shown in FIG. 4 may operate under two modes when outputting the output data Data_out to the outer terminal by swinging the output data Data_out. These two modes may include a first operation mode, during which the first output section 210 is activated and the second output section 220 is deactivated, and a second operation mode, during which both the first output section 210 and the second output section 220 are activated.

When the pre drive signal Predrv is activated and the output buffer device outputs the output data Data_out to the output terminal by swinging the output data Data_out, the operation of the output buffer device under the first operation mode or the second operation mode may be determined by the driving force control signal Ctl_pwr. This is because, if the pre drive signal Predrv is activated, the second drive signal Drv_2 capable of activating the second output section 220 may be determined based on whether the driving force control signal Ctl_pwr has a high level or a low level, as described above. If the second drive signal Drv_2 is deactivated, the second output section 220 may be deactivated, and the output buffer device operates under the first operation mode. If the second drive signal Drv_2 is activated, the second output section 220 may be activated, and the output buffer device may operate under the second operation mode. When the output data Data_out is outputted by being swung, the output data Data_out may be outputted through one PMOS transistor P1 and one NMOS transistor N1 in the first operation mode, and may be outputted through two PMOS transistors P1 and P2 connected in parallel and two NMOS transistors N1 and N2 connected in parallel in the second operation mode. Therefore, the driving force in the second operation mode may be larger than the driving force in the first operation mode. The larger driving force means that a time for pulling up or down a signal is short and a slew rate is great.

The terminal connecting unit 300 may include a third NMOS transistor N3 that is activated in response to the determination signal mrs. A mode register set (MRS) signal may be used as the determination signal mrs. The terminal connecting unit 300 may be connected between the output terminal and the terminal sensing unit 400. As the third NMOS transistor N3 is activated, the terminal connecting unit 300 may connect the output terminal and the terminal sensing unit 400.

The terminal sensing unit 400 may be connected with the output terminal when the terminal connecting unit 300 is activated. The terminal sensing unit 400 may sense the state of the output terminal. As stated above, the output buffer device shown in FIG. 4 may change a driving force based on whether the termination resistance Rtt and the termination voltage Vtt exist in the receiver of the external application connected to the output terminal. The terminal sensing unit 400 may include a current sensor for sensing whether current flows through the terminal connecting unit 300. The terminal sensing unit 400 may sense whether current is inputted from the output terminal through the terminal connecting unit 300. The terminal sensing unit 400 may output the terminal state signal Stat_tem by activating or deactivating the terminal state signal Stat_tem.

The driving force determining unit 500 may include two NAND gates and one inverter, a third inverter IV3. The two NAND gates may include a third NAND gate ND3 and a fourth NAND gate ND4. The third NAND gate ND3 and the fourth NAND gate ND4 may constitute an SR latch. The outputs of the SR latch may be fed back as inputs of the SR latch. The third inverter IV3 may invert the terminal state signal Stat-tem inputted by the third inverter IV3. The third inverter IV3 may output the inverted level of the terminal state signal Stat_tem to the third NAND gate ND3. The driving force determining unit 500 may receive the terminal state signal Stat_tem and the reset signal Rst, execute an SR latch logical operation, and output the driving force control Ctl_pwr by activating or deactivating the driving force control signal Ctl_pwr. Due to the characteristics of the SR latch constituted by the NAND gates, when the terminal state signal Stat_tem is activated, the driving force control signal Ctl_pwr may be activated, and the when the reset signal Rst is activated, the driving force control signal Ctl_pwr may be deactivated.

The operating principle of the output buffer device shown in FIG. 4 with lapse of time will be described below with reference to timing diagrams shown in FIGS. 5 and 6.

Figure 5:
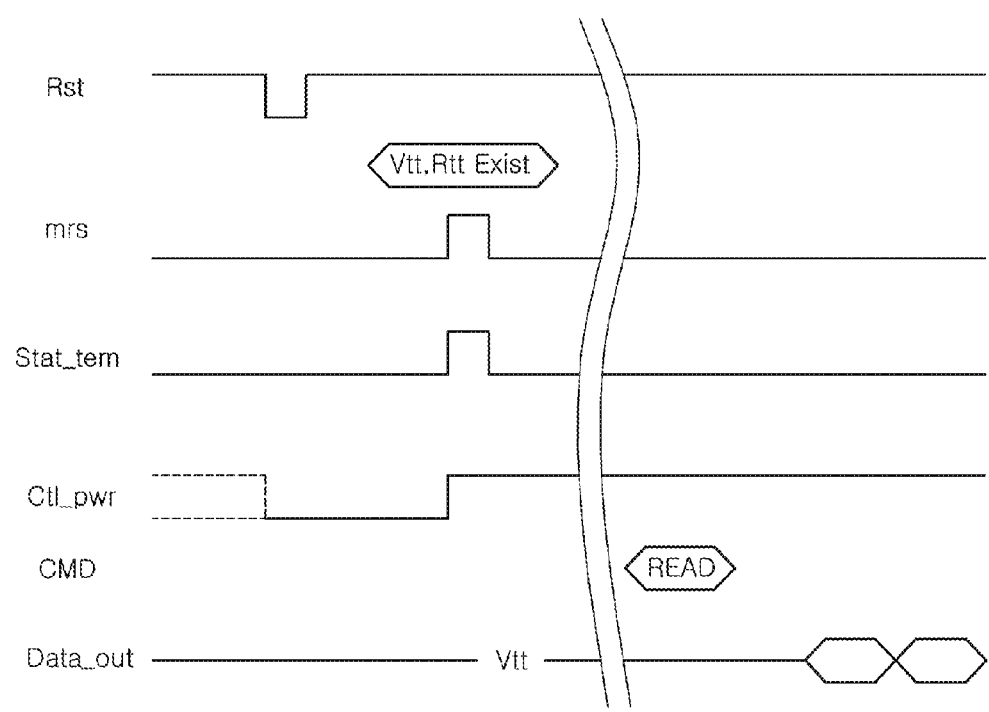
FIG. 5 is a timing diagram illustrating a case where a termination voltage and a termination resistance exist in a receiver of an external application that is connected to the semiconductor integrated circuit shown in FIG. 4.
Figure 6:
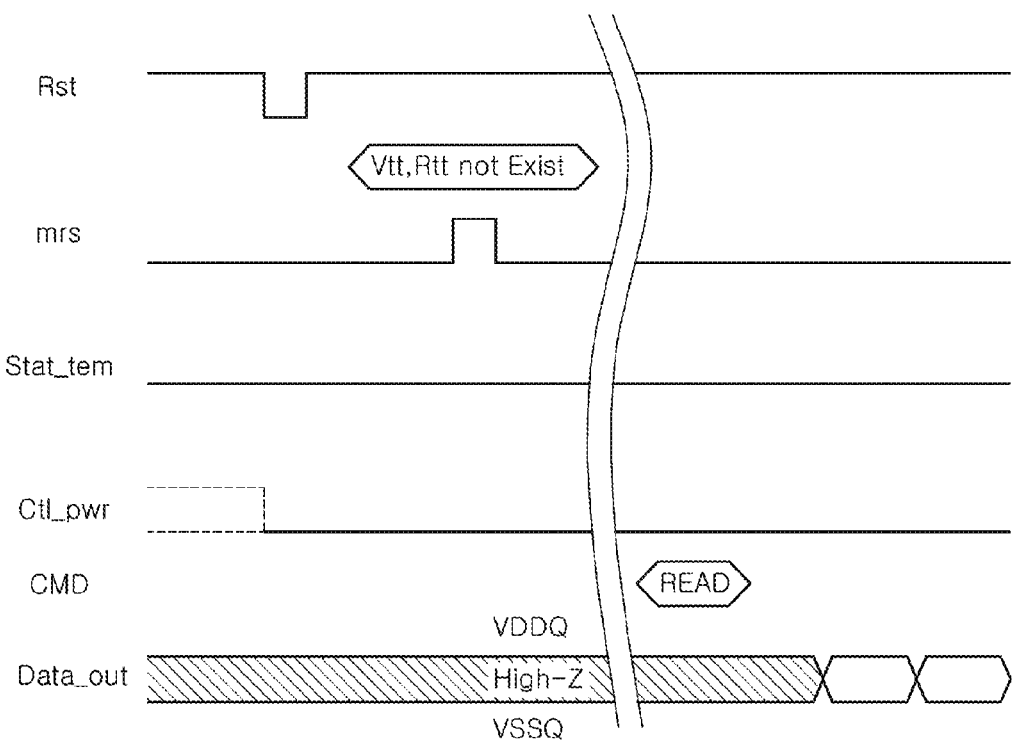
FIG. 6 is a timing diagram illustrating a case where a termination voltage and a termination resistance do not exist in a receiver of an external application that is connected to the semiconductor integrated circuit shown in FIG. 4.

FIGS. 5 and 6 are timing diagrams of the signals inputted to the output buffer device shown in FIG. 4 and the output data Data_out. The timing diagram of FIG. 5 illustrates a case where the termination voltage Vtt and the termination resistance Rtt exist in the receiver of the external application connected to the output buffer device shown in FIG. 4. The timing diagram of FIG. 6 illustrates a case where the termination voltage Vtt and the termination resistance Rtt do not exist in the receiver of the external application connected to the output buffer device shown in FIG. 4.

In FIG. 5, when the receiver is connected to the output buffer device, the reset signal Rst may be activated. When the reset signal Rst is activated, the driving force determining unit 500 may output the driving force control signal Ctl_pwr by deactivating the driving force control signal Ctl_pwr through SR latching. Because the driving force determining unit 500 may include the SR latch constituted by the NAND gates, the reset signal Rst may correspond to a low pulse signal.

The determination signal mrs may be activated. When the determination signal mrs is activated, the terminal connecting unit 300 may be activated and the terminal connecting unit 300 may connect the output terminal and the terminal sensing unit 400. Since the timing diagram of FIG. 5 illustrates the case where the termination resistance Rtt and the termination voltage Vtt exist in the receiver of the external application connected to the output buffer device, current may flow from the termination voltage Vtt through the terminal connecting unit 300 to the terminal sensing unit 400. The terminal sensing unit 400 may sense the current and output the terminal state signal Stat_tem by activating the terminal state signal Stat_tem.

If the terminal state signal Stat_tem is activated, the third inverter IV3 of the driving force determining unit 500 may invert the terminal state signal Stat_tem into an inverted level and the third inverter IV3 may input the inverted level of the terminal state signal Stat_tem to the SR latch constituted by the third NAND gate ND3 and the fourth NAND gate ND4. The SR latch may activate, through the logical operation, the driving force control signal Ctl_pwr, which is deactivated by the reset signal Rst. The SR latch may output the activated driving force control signal Ctl_pwr. As a consequence, the driving force determining unit 500 may receive the activated terminal state signal Stat_tem and output the driving force control signal Ctl_pwr by latching it to the activated state.

Thereafter, when the pre drive signal Predrv is inputted by being activated in response to a read command, the pre driver unit 100 may activate and output the first drive signal Drv_1 and the pre driver unit 100 may deactivate and output the second drive signal Drv_2. Accordingly, the main driver unit 200 may operate under the first operation mode in which only the first output section 210 is activated. The output data Data_out is driven by a smaller driving force than under the second operation mode.

In FIG. 6, when the receiver is connected to the output buffer device, the reset signal Rst may be activated. When the reset signal Rst is activated, the driving force determining unit 500 may deactivate the driving force control signal Ctl_pwr through the SR latch logical operation and the driving force determining unit 500 may output the deactivated driving force control signal Ctl_pwr. Since the driving force determining unit 500 may include the SR latch constituted by the NAND gates, the reset signal Rst may correspond to a low pulse signal.

The determination signal mrs may be activated. When the determination signal mrs is activated, the terminal connecting unit 300 may be activated and may connects the output terminal and the terminal sensing unit 400. Since the timing diagram of FIG. 6 represents the case where the termination resistance Rtt and the termination voltage Vtt do not exist in the receiver of the external application connected to the output buffer device, no current may flow from the termination voltage Vtt through the terminal connecting unit 300 to the terminal sensing unit 400. The terminal sensing unit 400 may sense no current and may output the terminal state signal Stat_tem by deactivating the terminal state signal Stat_tem.

When the terminal state signal Stat_tem is deactivated, the third inverter IV3 of the driving force determining unit 500 may invert the terminal state signal Stat_tem into an inverted level, and the third inverter IV3 may input the inverted level of the terminal state signal Stat_tem to the SR latch constituted by the third NAND gate ND3 and the fourth NAND gate ND4. The SR latch may output, through the logical operation, the driving force control signal. Ctl_pwr, which is deactivated by the reset signal Rst, as it is. As a consequence, the driving force determining unit 500 may receive the deactivated terminal state signal Stat_tem and output the driving force control signal Ctl_pwr by latching it to the deactivated state.

Thereafter, when the pre drive signal Predrv is inputted by being activated in response to a read command, the pre driver unit 100 may activate and outputs both the first drive signal Drv_1 and the second drive signal Drv_2 as the main drive signal Maindrv. Accordingly, the main driver unit 200 may operate under the second operation mode during which both the first output section 210 and the second output section 220 are activated. The output data Data_out may be driven by a larger driving force than under the first operation mode.

As described above with reference to FIG. 2, if the termination voltage Vtt and the termination resistance Rtt do not exist in the receiver of the external application, when the output terminal is in the high impedance (high-Z) state, a voltage level cannot be predicted and the data eye of the first output data Data_out, an access time from a clock (Tac), etc. are likely to be degraded at a time at which the output buffer device starts to swing. In the output buffer device in accordance with the embodiment of the invention shown in FIG. 4, the driving force of the main driver unit 500 may be made larger in the case where the termination voltage Vtt and the termination resistance Rtt do not exist in the receiver of the external application than in the case where the termination voltage Vtt and the termination resistance Rtt exist in the receiver of the external application. Therefore, it may be possible to substantially prevent the data eye of the first output data Data_out, an access time from a clock (Tac), etc. from being degraded at a timing at which the output buffer device starts to swing.

As described above, the output buffer device in accordance with the embodiment of the present invention may change a driving force based on whether the termination voltage Vtt and the termination resistance Rtt exist in the receiver of the external application connected to the output buffer device. As a consequence, it may be possible to substantially prevent the occurrence of the degradation of the characteristics of the output data Data_out, such as a decrease in data eye, lengthening of an access time from a clock (Tac), etc.

Also, since the output buffer device in accordance with the embodiment of the present invention may be used regardless of whether the termination voltage Vtt and the termination resistance Rtt exist in the receiver of the external application, redesign and revision costs likely to be incurred depending upon an application may be reduced or eliminated.

As is apparent form the above description, since the semiconductor integrated circuit in accordance with an embodiment of the present invention may control a driving force based on the state of an output terminal, the need for revision or redesign that is likely to occur depending upon an external application may be reduced. Also, the characteristics of output data may be controlled depending upon the state of the output terminal.

While a certain embodiments have been described above with reference to illustrative examples for particular applications, it will be understood to those skilled in the art that the embodiment described is by way of example only. Those skilled in the art with access to the teachings provided in this disclosure will recognize additional modifications, applications, and/or embodiments and additional fields in which the present disclosure would be of significant utility. Accordingly, the semiconductor integrated circuit described herein should not be limited based on the described embodiments. Rather, the semiconductor integrated circuit described herein should only be limited in light of the claims that follow when taken in conjunction with the above description and accompanying drawings.

What is claimed is:

1. A semiconductor integrated circuit for controlling output driving force comprising:
    a pre driver unit configured to receive a pre drive signal and a driving force control signal and output a main drive signal;
    a main driver unit configured to receive the main drive signal and output output data to an output terminal;
    a terminal sensing unit configured to sense the output terminal and output a terminal state signal;
    a terminal connecting unit configured to receive a determination signal and connect or disconnect the output terminal and the terminal sensing unit in response to the determination signal; and
    a driving force determining unit configured to receive a reset signal and the terminal state signal and output the driving force control signal.

2. The semiconductor integrated circuit according to claim 1, wherein the pre driver unit performs a logical operation using the pre drive signal and the driving force control signal, generates a first drive signal and a second drive signal, and outputs the first drive signal and the second drive signal as the main drive signal.

3. The semiconductor integrated circuit according to claim 2, wherein the main driver unit comprises:
    a first output section configured to activate in response to the first drive signal; and
    a second output section configured to activate in response to the second drive signal.

4. The semiconductor integrated circuit according to claim 3, wherein the main driver unit controls a driving force by activating at least one of the first output section and the second output section.

5. The semiconductor integrated circuit according to claim 1, wherein the determination signal comprises a mode register set signal.

6. The semiconductor integrated circuit according to claim 1, wherein the terminal sensing unit senses whether a voltage supply source is connected to the output terminal and outputs the terminal state signal based on a sensed result.

7. The semiconductor integrated circuit according to claim 1, wherein the driving force determining unit deactivates and outputs the driving force control signal when the reset signal is activated, and activates and outputs the driving force control signal when the received terminal state signal is in an activated state.

* * * * *